United States Patent
Akcakaya et al.

(10) Patent No.: US 11,714,152 B2
(45) Date of Patent: Aug. 1, 2023

(54) METHODS FOR SCAN-SPECIFIC ARTIFACT REDUCTION IN ACCELERATED MAGNETIC RESONANCE IMAGING USING RESIDUAL MACHINE LEARNING ALGORITHMS

(71) Applicant: REGENTS OF THE UNIVERSITY OF MINNESOTA, Minneapolis, MN (US)

(72) Inventors: Mehmet Akcakaya, Minneapolis, MN (US); Steen Moeller, Minneapolis, MN (US); Chi Zhang, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 351 days.

(21) Appl. No.: 16/858,922

(22) Filed: Apr. 27, 2020

(65) Prior Publication Data

US 2020/0341103 A1    Oct. 29, 2020

Related U.S. Application Data

(60) Provisional application No. 62/839,073, filed on Apr. 26, 2019.

(51) Int. Cl.
| | |
|---|---|
| *G01R 33/58* | (2006.01) |
| *G01R 33/56* | (2006.01) |
| *G06N 3/08* | (2023.01) |
| *G06N 3/048* | (2023.01) |
| *G01R 33/565* | (2006.01) |

(52) U.S. Cl.
CPC ......... *G01R 33/58* (2013.01); *G01R 33/5608* (2013.01); *G06N 3/048* (2023.01); *G06N 3/08* (2013.01); *G01R 33/56545* (2013.01)

(58) Field of Classification Search
CPC .......... G01R 33/56545; G01R 33/5608; G01R 33/58
See application file for complete search history.

(56) References Cited

U.S. PATENT DOCUMENTS

2018/0293762 A1* 10/2018 Fu .................. G06T 11/003
2019/0005195 A1*  1/2019 Peterson ............. G16H 50/20
(Continued)

OTHER PUBLICATIONS

Aggarwal HK, et al. MoDL: Model Based Deep Learning Architecture for Inverse Problems. IEEE Trans Med Imaging, 2018.
(Continued)

*Primary Examiner* — Dixomara Vargas
(74) *Attorney, Agent, or Firm* — Quarles & Brady LLP (57) ABSTRACT

Images are reconstructed from undersampled k-space data using a residual machine learning algorithm (e.g., a ResNet architecture) to estimate missing k-space lines from acquired k-space data with improved noise resilience. Using a residual machine learning algorithm provides for combining the advantages of both linear and nonlinear k-space reconstructions. The linear residual connection can implement a convolution that estimates most of the energy in k-space, and the multi-layer machine learning algorithm can be implemented with nonlinear activation functions to estimate imperfections, such as noise amplification due to coil geometry, that arise from the linear component.

21 Claims, 5 Drawing Sheets

(56) References Cited

U.S. PATENT DOCUMENTS

| | | | |
|---|---|---|---|
| 2019/0005200 A1* | 1/2019 | Zimmerman | G16H 50/30 |
| 2019/0138693 A1* | 5/2019 | Muller | G06N 3/02 |
| 2019/0347772 A1* | 11/2019 | Zhang | A61B 5/7267 |
| 2020/0184252 A1* | 6/2020 | Syeda-Mahmood | G06K 9/6274 |
| 2020/0210268 A1* | 7/2020 | Nuthi | G05B 23/0275 |
| 2020/0210850 A1* | 7/2020 | Nuthi | G06N 3/10 |
| 2020/0210966 A1* | 7/2020 | Nuthi | G06Q 10/20 |
| 2020/0211699 A1* | 7/2020 | Nuthi | G16H 40/40 |
| 2020/0333416 A1 | 10/2020 | Moeller | |
| 2021/0090306 A1* | 3/2021 | Akcakaya | G06N 3/04 |

OTHER PUBLICATIONS

Akcakaya, M., et al. "Scan-specific robust artificial-neural-networks for k-space interpolation (RAKI) reconstruction: Database-free deep learning for fast imaging." Magnetic resonance in medicine 81.1 (2019): 439-453.

Barth, M. et al. "Simultaneous multislice (SMS) imaging techniques," Magn. Reson. Med., vol. 75, No. 1, pp. 63-81, 2016.

Cheng, JY et al. "DeepSPIRiT: generalized parallel imaging using deep convolutional neural networks," Proc. of the Joint Annual Meeting of ISMRMESMRMB, pp. 570, 2018.

Dar S.U.H. et al., "Transfer learning for reconstruction of accelerated MRI acquisitions via neural networks." Proc. of the 26th Scientific Meeting of ISMRM, 0569, 2018.

Doshi-Velez F. et al. "Towards a rigorous science of interpretable machine learning," arXiv preprint, arXiv:1702.08608, 2017.

Eldar, YC et al, "Challenges and Open Problems in Signal Processing: Panel Discussion Summary from ICASSP 2017 [Panel and Forum]," IEEE Signal Processing Mag, vol. 34, No. 6, pp. 8-23, 2017.

Eo, T. et al. "KIKI-net: crossdomain convolutional neural networks for reconstructing undersampled magnetic resonance images," Magn. Reson. Med., vol. 80, No. 5, pp. 2188-2201, 2018.

Griswold MA, et al. Generalized autocalibrating partially parallel acquisitions (GRAPPA). Magn Reson Med. Jun. 2002;47(6):1202-1210.

Hammernik K, et al. Learning a variational network for reconstruction of accelerated MRI data. Magn Reson Med. Jun. 2018;79(6):3055-3071.

Han Y, et al. Deep learning with domain adaptation for accelerated projection-reconstruction MR. Magn Reson Med. Sep. 2018;80(3):1189-1205.

He K, et al. Deep residual learning for image recognition. Proc CVPR 2016. pp. 770-778.

Hosseini, S.A.H. et al. "Accelerated Coronary MRI with sRAKI: A Database-Free Self-Consistent Neural Network k-space Reconstruction for Arbitrary Undersampling," arXiv preprint, arXiv.1907.08137, 2019.

Hosseini, S.A.H. et al. "sRAKI-RNN: accelerated MRI with scan-specific recurrent neural networks using densely connected blocks," Proc. of Wavelets and Sparsity XVIII, International Society for Optics and Photonics, vol. 11138, pp. 111381B, 2019.

Hyun, CM et al, "Deep learning for undersampled MRI reconstruction," Phys Med Biol, vol. 63, No. 13, pp. 135007, 2018.

Kingma, DP et al. "Adam: A method for stochastic optimization," Proc. of ICLR, 2015.

Kwon K, et al. A parallel MR imaging method using multilayer perceptron. Med Phys, vol. 44, pp. 6209-6224, 2017.

Larkman, DJ et al, "Use of multicoil arrays for separation of signal from multiple slices simultaneously excited," J. Magn. Reson. Img., Feb. 2001, vol. 13, No. 2, pp. 313-317, 2001.

Lee D, et al. Deep Residual Learning for Accelerated MRI using Magnitude and Phase Networks. IEEE Trans Biomed Eng. 2018(65): 1985-1995.

Lustig, M. et al. "Sparse MRI: The application of compressed sensing for rapid MR imaging," Magn. Reson. Med., vol. 58, No. 6, pp. 1182-1195, 2007.

Moeller S, et al. Multiband multislice GE-EPI at 7 tesla, with 16-fold acceleration using partial parallel imaging with application to high spatial and temporal whole-brain fMRI. Magn Reson Med. May 2010;63(5):1144-53.

Pruessmann, KP et al. "SENSE: sensitivity encoding for fast MRI," Magn. Reson. Med., vol. 42, No. 5, pp. 952-962, 1999.

Qin, C. et al, "Convolutional recurrent neural networks for dynamic MR image reconstruction," IEEE Trans. Med. Imaging, vol. 38, No. 1, pp. 280-290, Jan. 2019.

Robson, PM et al. "Comprehensive quantification of signal-to-noise ratio and g-factor for image-based and k-space-based parallel imaging reconstructions," Magn. Reson. Med., vol. 60, No. 4, pp. 895-907, 2008.

Roemer, PB et al. "The NMR phased array," Magn. Reson. Med., vol. 16, pp. 192-225, 1990.

Samek, W. et al. "Explainable artificial intelligence: Understanding, visualizing and interpreting deep learning models," arXiv preprint, arXiv:1708.08296, 2017.

Schlemper J, et al. A deep cascade of convolutional neural networks for dynamic MR image reconstruction. IEEE Trans Med Imaging, vol. 37, pp. 491-503, 2018.

Setsompop, K. et al. "Blipped-controlled aliasing in parallel imaging for simultaneous multislice echo planar imaging with reduced g-factor penalty," Magn. Reson. Med., vol. 67, No. 5, pp. 1210-1224, 2012.

Sodickson, DK et al. "Simultaneous acquisition of spatial harmonics (SMASH): fast imaging with radiofrequency coil arrays," Magn. Reson. Med., vol. 38, No. 4, pp. 591-603, 1997.

Van Essen, DC et al, "The Human Connectome Project: a data acquisition perspective," Neuroimage, vol. 62, pp. 2222-2231, 2012.

Van Essen, DC et al, "The WU-Minn human connectome project: an overview," Neuroimage, vol. 80, pp. 62-79, 2013.

Wang S, et al. Accelerating magnetic resonance imaging via deep learning. Proc ISBI 2016, pp. 514-517.

Weiger, M. et al. "2D Sense for faster 3D MRI," MAGMA, vol. 14, pp. 10-19, 2002.

Yang, G. et al. "DAGAN: Deep De-Aliasing Generative Adversarial Networks for Fast Compressed Sensing MRI Reconstruction," IEEE Trans. Med. Imag., vol. 37, pp. 1310-1321, 2018.

Zahneisen, B. et al. "SENSE and simultaneous multislice imaging," Magn Reson Med vol. 74, pp. 1356-1362, 2015.

Zhang, C. et al. "Accelerated Simultaneous Multi-Slice MRI using Subject-Specific Convolutional Neural Networks," Proc. of 52nd Asilomar Conference on Signals, Systems, and Computers, pp. 1636-1640, IEEE, 2018.

Zhang, C., et al. "Scan-specific residual convolutional neural networks for fast MRI using residual RAKI." 2019 53rd Asilomar Conference on Signals, Systems, and Computers. IEEE, 2019.

* cited by examiner

METHODS FOR SCAN-SPECIFIC ARTIFACT REDUCTION IN ACCELERATED MAGNETIC RESONANCE IMAGING USING RESIDUAL MACHINE LEARNING ALGORITHMS

CROSS-REFERENCE TO RELATED APPLICATIONS

This application claims the benefit of U.S. Provisional Patent Application Ser. No. 62/839,073, filed on Apr. 26, 2019, and entitled "METHODS FOR SCAN-SPECIFIC ARTIFACT REDUCTION IN ACCELERATED MAGNETIC RESONANCE IMAGING USING RESIDUAL MACHINE LEARNING ALGORITHMS," which is herein incorporated by reference in its entirety.

STATEMENT REGARDING FEDERALLY SPONSORED RESEARCH

This invention was made with government support under HL111410, EB015894, and EB025144, awarded by the National Institutes for Health. The government has certain rights in the invention.

BACKGROUND

Accelerated imaging is frequently used in clinical MRI, by means of parallel imaging techniques. GRAPPA is one such method that performs linear interpolation in k-space using convolutional kernels, estimated from auto-calibration signal ("ACS") data. Alternative accelerated reconstruction methods based on machine learning ("ML") have recently received interest, with a focus on generating advanced regularizers trained on large databases of MR images. In another line of work, called robust artificial-neural-networks for k-space interpolation ("RAKI"), a nonlinear k-space interpolation method was proposed. The RAKI method is described in co-pending Patent Application No. PCT/US2018/022348, which is herein incorporated by reference in its entirety. The RAKI method uses subject-specific ML algorithms, such as convolutional neural networks ("CNNs"), trained on ACS data, and showed improvement in terms of noise resilience over GRAPPA. However, linear interpolation holds advantages, such as requiring fewer ACS data.

SUMMARY OF THE DISCLOSURE

The present disclosure addresses the aforementioned drawbacks by providing a method for reconstructing an image from undersampled k-space data acquired with a magnetic resonance imaging (MRI) system. The method includes providing undersampled k-space data and calibration data acquired with an MRI system to a computer system. The calibration data are processed with the computer system to learn parameters for a residual machine learning algorithm implemented with a hardware processor and memory of the computer system. The residual machine learning algorithm includes a linear residual connection and a multi-layer portion having at least one nonlinear processing layer. Missing k-space data are estimated by inputting the undersampled k-space data to the residual machine learning algorithm, generating output as the missing k-space data. An image is reconstructed from the undersampled k-space data and the estimated missing k-space data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for reconstructing images from undersampled k-space data using a residual machine learning algorithm to estimate missing k-space lines from acquired k-space data with improved noise resilience. As one example, the residual machine learning algorithm may be a residual convolutional neural network ("CNN"), such as a ResNet. Using a residual machine learning algorithm provides for combining the advantages of both linear and nonlinear k-space reconstructions. For instance, a residual machine learning algorithm can include a linear residual connection and a multi-layer machine learning algorithm. The linear residual connection can implement a convolution that estimates most of the energy in k-space, and the multi-layer machine learning algorithm can be implemented with nonlinear activation functions to estimate imperfections, such as noise amplification due to coil geometry, that arise from the linear component. Using the systems and methods described in the present disclosure, higher acceleration rates can be achieved while also benefitting from better noise properties.

In general, the residual machine learning algorithm is trained on calibration data, such as auto-calibration signal ("ACS") data. In some implementations the linear residual connection can be trained to have different weights, biases, or both, than the multi-layer portion of the residual machine learning algorithm.

In the systems and methods described in the present disclosure, a linear estimation, such as the linear estimation in GRAPPA, that utilizes convolutional kernels is augmented with a nonlinear estimation that utilizes CNNs, or other suitable machine learning algorithms. In other implementations, the linear GRAPPA operator can be replaced with other linear operators, such as self-calibrated interpolation of non-Cartesian data with GRAPPA ("SING") described in co-pending Patent Application No. 62/836,333, and region-specific reconstruction kernels described in Patent Application No. 62/838,446, both of which are herein incorporated by reference in their entirety. The systems and methods described in the present disclosure are designed to calibrate the CNN, or other suitable machine learning algorithm, from ACS data without necessitating use of an external training database for learning.

CNNs are a special type of artificial neural network that are simple mathematical models that estimate a (potentially nonlinear) function $f:X \to Y$ for two arbitrary sets X and Y. A CNN combines multiple layers of simple modules, such as linear convolutions and certain point-wise nonlinear operators, in order to effectively represent complex functions of interest.

Figure 1:
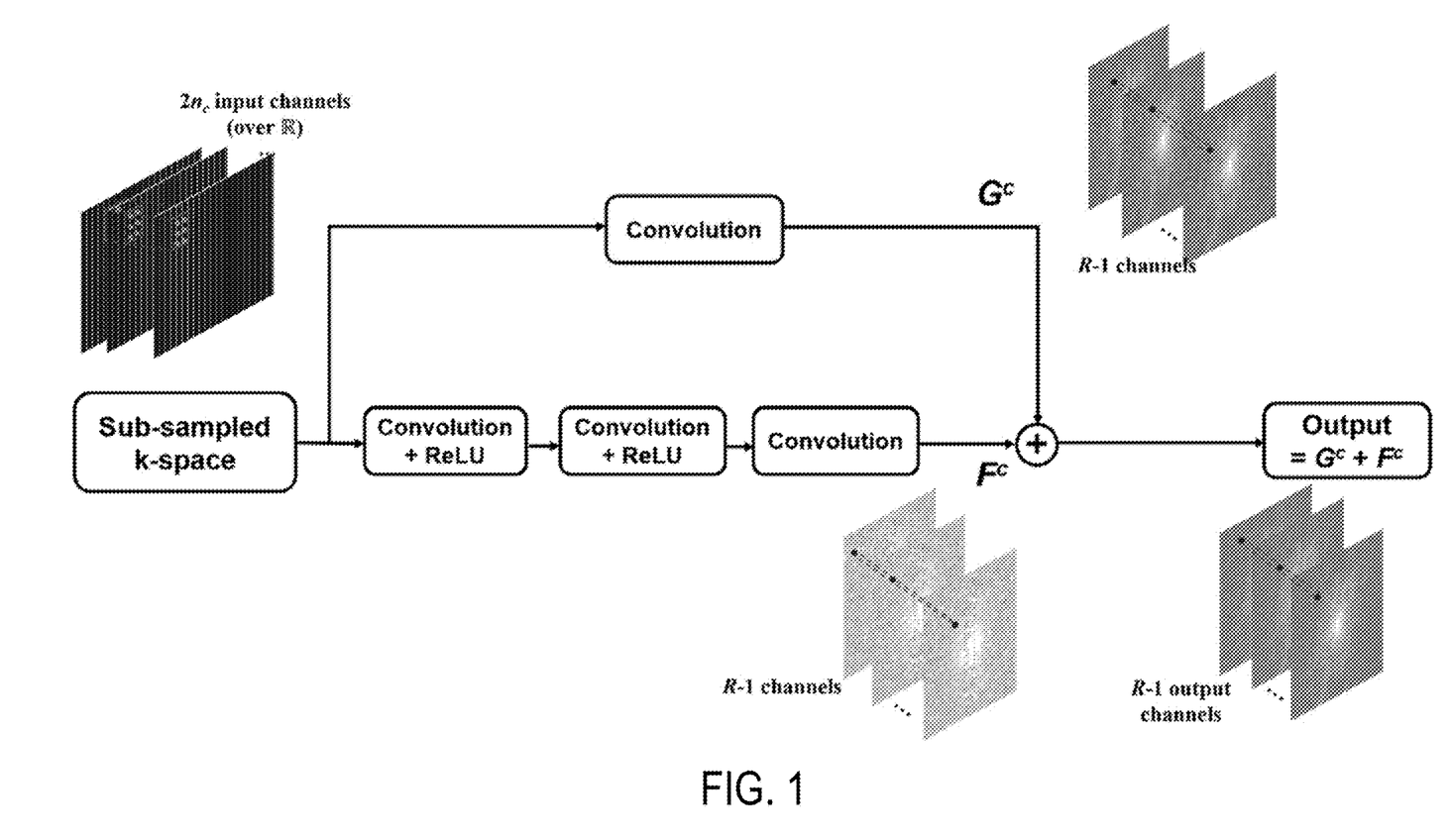
FIG. 1 illustrates an example residual convolutional neural network ("CNN") that can implement the methods described in the present disclosure.

FIG. 1 depicts an example residual CNN architecture that can be implemented to estimate additional k-space data from input uniformly undersampled k-space data. The network takes an input of all sampled data across all coils and outputs all the missing lines for a given coil. In some implementations, the network can be designed to estimate more channels together instead of designing one CNN per coil element. The residual connection implements a linear reconstruction based on a shift-invariant k-space convolution, which is denoted by $G^c$. The multi-layer feedforward network for estimating the artifacts uses, in this non-limiting example, a 3-layer architecture, which is denoted by $F^c$. The final reconstruction result combines these two components as, $$R^c(x) = F^c(x) + G^c(x) \quad (1).$$

This network is trained end-to-end on the subject-specific ACS data. As one non-limiting example, the following objective function can be used for training the network on the subject-specific ACS data:

$$\min \|s(x) - R^c(x)\|_2^2 + \lambda \|s(x) - G^c(x)\|_2^2 \quad (2);$$

where $s(x)$ are the target k-space points in the ACS data, which are generated similar to GRAPPA reconstruction; $G^c(x) = w_g^c * x$ is a convolution; $F^c(x) = F_3^c(F_2^c(F_1^c(x)))$ is a 3-layer network with $F_1^c(x) = \text{ReLU}(w_1^c * x)$, $F_2^c(x) = \text{ReLU}(w_2^c * x)$, and $F_2^c(x) = \text{ReLU}(w_2^c * x)$; and $\lambda$ creates a weighting between two components. As one non-limiting example, $\lambda = 1$ can be used.

It is noted that a complex-valued k-space dataset, s, of size $n_x \times n_y \times n_c$, can be embedded into a real-valued space as a dataset of size $n_x \times n_y \times 2n_c$, where the real part of s is concatenated with the imaginary part of s along the third (channel) dimension. Thus, effectively $2n_c$ input channels can be processed. Other embeddings, which will change dimensionality in the other dimensions, are also possible. In some instances, complex convolutions can be implemented on real embeddings.

As shown in the example of FIG. 1, the residual CNN acts on a local neighborhood of acquired points, as in GRAPPA, and includes a residual connection with a linear convolution and a multi-layer CNN with nonlinear processing. As noted above, each layer in the multi-layer CNN will contain a convolution operation, which may be specified by a set of convolution weights, $w_k$, and optional bias correction, $\beta_k$. Thus, the convolution operation at layer k performs, $$F_k^{conv}(y_k, w_k, \beta_k) = y_k * w_k + \beta_k \quad (3).$$

This is a multi-dimensional convolution, For the sake of simplicity, a two-dimensional convolution is described here; however, it will be appreciated by those skilled in the art that the convolution can readily be extended to higher dimensions. In the two-dimensional example, $w_k$ and $\beta_k$ have dimension $m_{k,1} \times m_{k,2} \times n_{k,i} \times n_{k,o}$ where $m_{k,1} m_{k,2}$ specifies the 2D localization; $n_{k,i}$ is the number of input channels, and $n_{k,o}$ is the number of output channels. For instance, for the first layer, $n_{k,i}$ can be taken as the number of coils in the acquisition. The number of output channels, $n_{k,o}$, tends to be larger than $n_{k,i}$, especially in the earlier layers, for successful feature extraction. As one example, the number of output channels can be equal to $(R-1) \cdot n_c$.

The nonlinear processing can be achieved using an activation function on the output of the convolution, $$ACT(F_k^{conv}(y_k, w_k, \beta_k)) \quad (4).$$

As one example, the activation function can be a rectified linear unit ("ReLU"), which can be defined as, $$\text{ReLU}(x) = \max(x, 0) \quad (5).$$

In some implementations, a batch normalization can be applied between the convolution and the activation function. Thus, denoting the nonlinearities at level k by $F_{k,non}$, the overall layer k function can be given as, $$F_k(y_k) = F_{k,non}(F_{k,conv}(y_k, w_k, \beta_k)) \quad (6).$$

It will be appreciated also that additional processing can be applied to the output of the convolution operation. For instance, resampling, upsampling, downsampling, max pooling, and so on, could be applied to the output of the convolution operation, whether before or after the nonlinear activation function is applied. In some instances, in the last layer, only a convolution operation can be performed. For example, in these instances the last layer, K, can have, $$F_K(y_K) = F_K^c(y_K, w_K, \beta_K) \quad (7).$$

The training portion of the algorithm aims to find the relevant parameters for the $k^{th}$ level (e.g., the convolution weights, or both weights and biases) for specified $m_{k,1}$, $m_{k,2}$, $n_{k,i}$, and $n_{k,o}$, and for all levels. Once these parameters are trained, the residual CNN is applied to the acquired undersampled k-space data to estimate the missing points in k-space.

Figure 2:
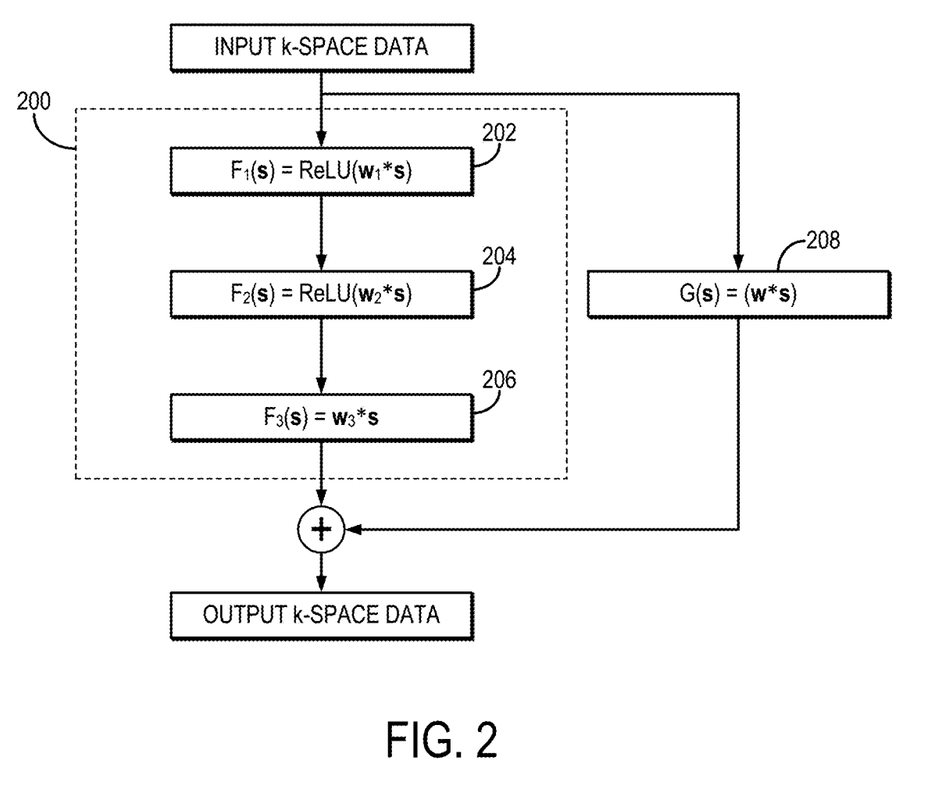
FIG. 2 illustrates another example of a residual CNN that can implement the methods described in the present disclosure.

Before the residual machine learning algorithm can be trained, its structure (e.g., the number of layers and layer operations) is determined. In one example implementation of the systems and methods described in the present disclosure, a three-layer structure can be used for the multi-layered machine learning algorithm used in the residual machine learning algorithm, as depicted in FIG. 2. Each layer in the multi-layer machine learning algorithm 200, except the last, is a combination of linear convolutional kernels and a nonlinear operation. As one example, the nonlinear operation can be a rectified linear unit ("ReLU"), which has desirable convergence properties. In other implementations, an activation function other than a ReLU function can also be used. As one example, the activation function could also be a sigmoid function. The first layer 202 receives as an input undersampled k-space data of size $n_x n_y \times 2n_c$, which in this instance is complex-valued data that has been embedded into the real field, as described above. The convolutional filters in this first layer 202, denoted by $w_1$, are of size $b_{1,x} \times b_{1,y} \times 2n_c \times n_1$. The operation of this layer is given as, $$F_1(s) = \text{ReLU}(w_1 * s) \quad (8);$$

although, as noted above, an activation function other than a ReLU function may also be implemented. The second layer 204 receives as an input the output from the first layer 202, and applies convolutional filters, denoted by $w_2$, of size $b_{2,x} \times b_{2,y} \times n_1 \times n_2$. The operation of this second layer 204 is given as, $$F_2(s) = \text{ReLU}(w_2 * s) \quad (9);$$

although, as noted above, an activation function other than a ReLU function may also be implemented. Intuitively, the first two layers are nonlinearly combining the acquired k-space lines. The final layer 206 produces the desired reconstruction output by applying convolutional filters, $w_3$, of size $b_{3,x} \times b_{3,y} \times n_2 \times n_{out}$, yielding, $$F_3(s) = w_3 * s \qquad (10)$$

Thus, in this example and in some other configurations, the final layer 206 can perform the output estimation without any nonlinear operations. In this example, the overall mapping is given by, $$F(s) = F_3(F_2(F_1(s))) \qquad (11).$$

As described above, the output of layer 206 is then combined with the output of a linear convolution layer 208 from a residual connection. In this residual connection, the input k-space data are applied to the linear convolution layer 208, generating output, $G(s) = w * S$ that is combined with the output of layer 206 to generate the output k-space data.

In order to learn a nonlinear reconstruction function, $F_j(\bullet)$, the unknown network parameters, $\theta_j = \{w_1, w_2, w_3\}$ for that input channel are first estimated. Note that the subscript, j, has been omitted for the kernels for ease of notation. The input received by the machine learning algorithm is the zero-filled acquired k-space lines, s. A loss function between the reconstructed k-space lines is minimized using $F_j(\bullet)$ and the known ground truth for the target missing k-space lines in the ACS region, denoted by $Y_j$, which can be formatted to match the output structure with the same number of $n_{out}$ channels in the third dimension. One example of a loss function that can be used is the mean squared error ("MSE"), $$L(\theta_j) = \|Y_j - F_j(s; \theta_j)\|_F^2 \qquad (12);$$

where $\|\bullet\|_F$ denotes the Frobenius norm. Instead of solving a linear least squares problem to calculate one set of convolutional kernels, as is done with GRAPPA, a nonlinear least squares problem is solved to calculate multiple sets of convolutional kernels. In one example implementation, a gradient descent with backpropagation and momentum can be employed to minimize Eqn. (12). In such an example, in order to update the convolutional kernels, at iteration t, the following can be used, $$\overline{w}_i^{(t)} = \mu \overline{w}_i^{(t-1)} + \eta \frac{\partial L}{\partial w_i^{(t-1)}}; \qquad (13)$$

$$w_i^{(t)} = w_i^{(t-1)} - \overline{w}_i^{(t)}; \qquad (14)$$

where $\mu$ is the momentum rate, $\eta$ is the learning rate, $i \in \{1,2,3\}$, and backpropagation is used to calculate the derivative, $\partial L / \partial w_i^{(t-1)}$. In some implementations, fixed values of the momentum rate and the learning rate can be used, and in some other implementations fixed rates are not used.

The same approach can be used to calculate all the convolutional filters in this example. Similarly, other parameters can be updated, including biases and batch normalization parameters, using this back propagation and gradient descent. Although stochastic gradient descent is popular in most deep learning applications due to the immense size of the training datasets, the methods described in the present disclosure can use a simple gradient descent due to the limited size of the ACS region. It will be appreciated, however, that stochastic gradient descent and other algorithms can be implemented to minimize Eqn. (12).

As shown, the multi-layer network is a feedforward network. In other implementations, the multi-layer network can utilize different architectures, such as a network having dense connections where the input to a layer is the concatenation of the output of all the previous layers.

Figure 3:
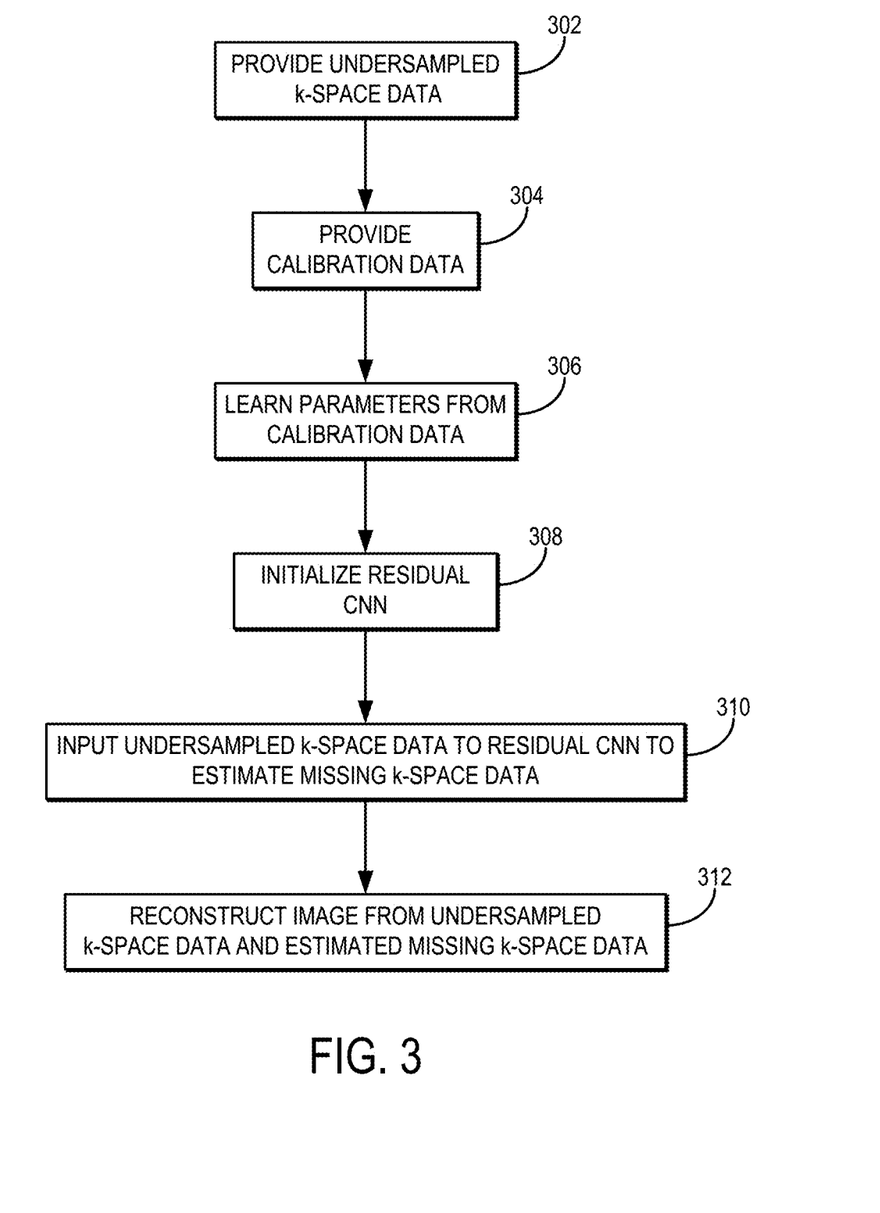
FIG. 3 is a flowchart setting forth the steps of an example method for training and implementing a residual CNN to estimate additional k-space data and reconstruct an image.

Referring now to FIG. 3, a flowchart is illustrated as setting forth the steps of an example method for reconstructing an image from undersampled k-space data using a residual machine learning algorithm that is implemented with a hardware processor and memory; that is trained on calibration data, such as auto-calibration signal ("ACS") data; and that implements nonlinear processing in a multi-layered machine learning algorithm together with linear processing in a residual connection. The method includes providing undersampled k-space data to a computer system for reconstruction, as indicated at step 302. Providing the undersampled k-space data can include retrieving previously acquired data from a memory or other data storage, or can include acquiring such data with an MRI system. Calibration data is also provided to the computer system, as indicated at step 304. In some embodiments, the calibration data includes ACS signal data that is acquired with the undersampled k-space data. In some other embodiments, the calibration data can include data acquired in a separate scan from the undersampled k-space data, such as in a calibration scan.

The calibration data are processed to learn parameters for the machine learning algorithm, as indicated at step 306. As part of this process, the particular machine learning algorithm structure (e.g., neural network architecture) is also selected. For instance, this can include selecting the number of layers in the multi-layered portion of the residual machine learning algorithm, the number of input channels at each layer and the residual connection, the number of output channels at each layer and the residual connection, and forming processing to be applied at each layer and the residual connection. The parameters for this selected structure are then learned. In general, at least some of the layers in the multi-layered portion of the residual machine learning algorithm will include nonlinear processing, as described above. Such nonlinear processing can be achieved using an activation function on the output of the convolution. The activation function may include a rectified linear unit or other suitable activation function. In some implementations, a batch normalization can be applied between the convolution and the activation function.

As one example, the learned parameters are weights for each layer in the multi-layer machine learning algorithm and for the linear convolution in the residual connection. In some instances, the learned parameters may also include biases for one or more of the layers in the machine learning algorithm. The learning framework can include generating a set of nonlinear functions whose composite application on y (i.e., the selected neighborhood of a target point) leads to X (i.e., the missing target value). The composite application of the nonlinear functions can be given as, $$F_{tot}(y) = F_{K,non}(F_{K-1,non}( \ldots (F_{2,non}(F_{1,non}(y))))) \qquad (15).$$

For all the target ACS training data, $X_{train}$, a loss function can be minimized. One such loss function is, $$\sum_{X_{train} \in ACS_{target}} \|F_{tot}(y) - X_{train}\|_2^2. \qquad (16)$$

It will be appreciated that the undersampled k-space data, the calibration data, or both can be preprocessed before the residual machine learning algorithm is initialized. For instance, k-space scaling could be applied to the undersampled k-space data, the calibration data, or both. As another example, a mean signal can be subtracted from the undersampled k-space data, the calibration data, or both. These and other preprocessing steps can be applied as desired.

The residual machine learning algorithm is then initialized based on the learned parameters, as indicated at step 308. For instance, the initialization can include initializing the selected machine learning algorithm structure, such as by using the learned parameters to initialize the layers in the multi-layered portion of the residual machine learning algorithm and the residual connection.

Having initialized the residual machine learning algorithm, undersampled k-space data are input to the residual machine learning algorithm to estimate unacquired, or otherwise missing, k-space data points, as indicated at step 310. In some implementations, the residual machine learning algorithm can also be configured to estimate new values for already measured k-space data, such that the measured k-space data can be replaced with the new estimates output from the machine learning algorithm. From the estimated missing k-space data and the original undersampled k-space data, images are then reconstructed, as indicated at step 312.

A residual machine learning algorithm architecture for interpolation of missing k-space lines using both linear and nonlinear components has been described. Importantly, both these components are trained only on subject-specific ACS data, without requiring a database of images. The systems and methods described in the present disclosure offer better noise resilience compared to GRAPPA, and fewer blurring artifacts compared to using only nonlinear components. Different weights can be implemented on linear and nonlinear components, allowing for increased flexibility in the residual machine learning algorithm. In some implementations, the linear convolutional kernel and the nonlinear component can be jointly trained. The proposed residual machine learning algorithm uses scan-specific machine learning algorithms trained on limited ACS data to learn reconstruction artifacts in addition to a linear reconstruction, and improves upon other k-space interpolation-based methods.

In some implementations, noise patterns can be artificially added when training the nonlinear components of the residual machine learning algorithm. Additionally or alternatively, a self-calibration term from the outer k-space regions can be added using the shift-invariance of the networks described in the present disclosure. These implementations, alone or in combination, can be utilized to train the residual machine learning algorithm with fewer calibration data.

In some instances, transfer learning can be used when training the residual machine learning network. For example, scan data with the same coil configuration can be used to pre-train a residual machine learning algorithm. This pre-trained residual machine learning algorithm can then be retrieved from memory or a suitable data storage device or medium. The pre-trained residual machine learning algorithm can be used as a starting point for scan-specific training.

Advantageously, the methods described in the present disclosure can be applied to different parallel image reconstruction techniques. As one non-limiting example, the methods can be combined with a parallel image reconstruction technique that synergistically combines different k-space interpolation strategies. For instance, the methods described here can be implemented together with a combination of both an rRAKI-type interpolation (which maintains acquired lines and fills in unsampled ones) and a SPIRiT-type interpolation (which can replace all the k-space lines due to self-consistency). In this way, closeness to rRAKI output, self-consistency like SPIRiT, consistency with acquired measurements, and regularization terms can be enforced.

In one non-limiting example, the advantages of rRAKI in removing aliasing artifacts, and of SPIRiT in enforcing self-consistency and enabling the use of regularization can be realized through a reconstruction technique that synergistically combines aspects of these techniques into a single, unified framework. In these instances, the following objective function can be solved:

$$\arg\min_{\kappa_1,\ldots,\kappa_n} \|P_\Omega(\kappa_1 + \ldots + \kappa_n) - \kappa_{MB}\|_2^2 + \quad (17)$$

$$\mu \left\| G_{MB}\kappa_{MB} - \begin{bmatrix} \kappa_1 \\ \vdots \\ \kappa_n \end{bmatrix} \right\|_2^2 + \sum_{i=1}^n \beta_i \|G_i\kappa_i - \kappa_i\|_2^2 + \sum_{i=1}^n \sigma_i \Psi(E_i\kappa_i);$$

where $P_\Omega$ is a sub-sampling operator that samples k-space data at locations specified by $\Omega$; K is the k-space data across all coils of the $i^{th}$ slice; $\kappa_{MB}$ is acquired multiband k-space data across all coils in k-space; $\mu$ is a Lagrange multiplier; $G_{MB}$ is an rRAKI operator; $G_i$ are self-consistency operators including convolutional kernels estimated from calibration data (e.g., ACS data) for the $i^{th}$ slice, which include contributions from all points, both acquired and missing, across all coils around a given k-space point; $\Psi$ is a regularizer; and $E_i$ is an operator that takes the inverse Fourier transform of all coil k-spaces in the $i^{th}$ slice and combined these images into one image using coil sensitivity maps, which can be referred to as a SENSE-1 combination.

As one non-limiting example, the regularizer, $\Psi$, can be the time-domain finite difference of each coil image. Other examples include regularizers based on wavelet-domain, total variation, manifold methods, or machine learning-based regularizers. As another example, the regularizer can be based on a locally low-rank ("LLR") constraint, as follows:

$$\Psi(x) = \sum_k \|B_k^b(x)\|_*; \quad (18)$$

where $B_k^b(x)$ is an operator that extracts a b×b block, whose top-left corner is at pixel k, from an image, vectorizes these, and stacks them up into a $b^2 \times n$ matrix, where n is the number of images in an image series. As one example, b=8 can be used. The operator, $\|\cdot\|_*$ in Eqn. (18) indicates the nuclear norm.

For in-plane accelerations without SMS/MB imaging, Eqn. (17) can be recast as the following:

$$\arg\min_\kappa \|P_\Omega(\kappa) - y\|_2^2 + \mu\|G_{rec}y - \kappa\|_2^2 + \beta\|G_{spirit}\kappa - \kappa\|_2^2 + \sigma\Psi(E\kappa); \quad (19)$$

where $\kappa$ is the reconstructed k-space, y is the measured k-space data at the locations specified by $\Omega$, $G_{rec}$ is the in-plane reconstruction used for reduction of aliasing (e.g., rRAKI), $G_{spirit}$ is the SPIRiT kernel for self-consistency, E is the encoding matrix that takes k-space data to image domain (e.g., with SENSE-1 combination), and $\Psi$ is a regularizer. Regularizers could be based on locally low-rank constraints, wavelet-domain, total variation, manifold methods, or machine learning-based regularizers.

Figure 4:
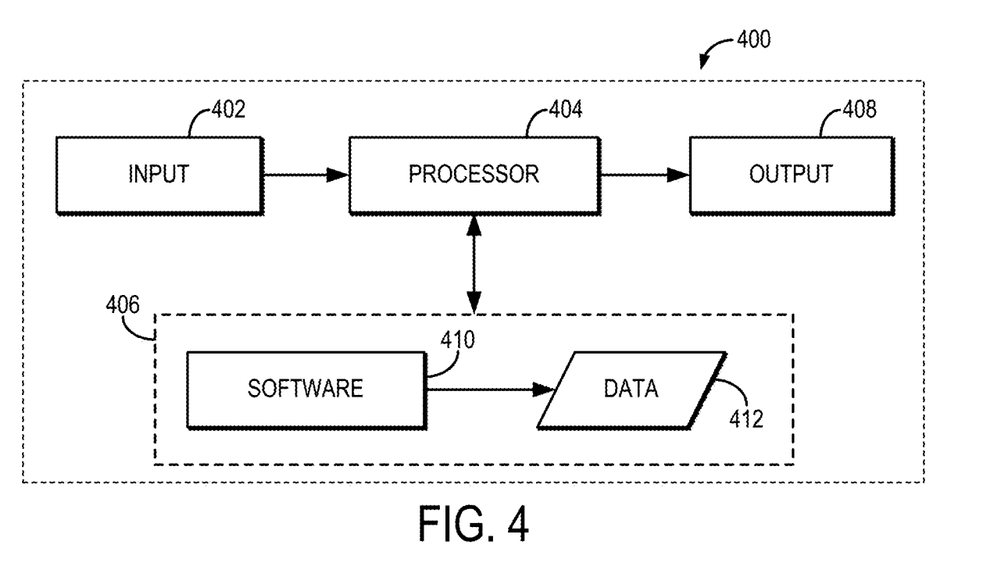
FIG. 4 is a block diagram of an example computer system that can implement the systems and methods described in the present disclosure.

Referring now to FIG. 4, a block diagram of an example of a computer system 400 that can implement the methods described in the present disclosure is shown. The computer system 400 includes an input 402, at least one processor 404, a memory 406, and an output 408. The computer system 400 can also include any suitable device for reading computer-readable storage media. The computer system 400 may be implemented, in some examples, as a workstation, a notebook computer, a tablet device, a mobile device, a multimedia device, a network server, a mainframe, or any other general-purpose or application-specific computing device.

The computer system 400 may operate autonomously or semi-autonomously, or may read executable software instructions from the memory 406 or a computer-readable medium (e.g., a hard drive, a CD-ROM, flash memory), or may receive instructions via the input 402 from a user, or any another source logically connected to a computer or device, such as another networked computer or server. In general, the computer system 400 is programmed or otherwise configured to implement the methods and algorithms described above.

The input 402 may take any suitable shape or form, as desired, for operation of the computer system 400, including the ability for selecting, entering, or otherwise specifying parameters consistent with performing tasks, processing data, or operating the computer system 400. In some aspects, the input 402 may be configured to receive data, such as undersampled k-space data, auto-calibration signal ("ACS") data, and so on. Such data may be processed as described above to train a residual machine learning algorithm, to estimate missing k-space data, to reconstruct magnetic resonance images, and so on. In addition, the input 402 may also be configured to receive any other data or information considered useful for training a residual machine learning algorithm, estimating missing k-space data, reconstructing magnetic resonance images, and so on, using the methods described above.

Among the processing tasks for operating the signal reconstruction unit 400, the at least one processor 404 may also be configured to carry out any number of post-processing steps on data received by way of the input 402.

The memory 406 may contain software 410 and data 412, such as magnetic resonance images, patient health data, and so on, and may be configured for storage and retrieval of processed information, instructions, and data to be processed by the at least one processor 404. In some aspects, the software 410 may contain instructions directed to implementing the methods described in the present disclosure.

In addition, the output 408 may take any shape or form, as desired, and may be configured for displaying, in addition to other desired information, reconstructed signals or images.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

Figure 5:
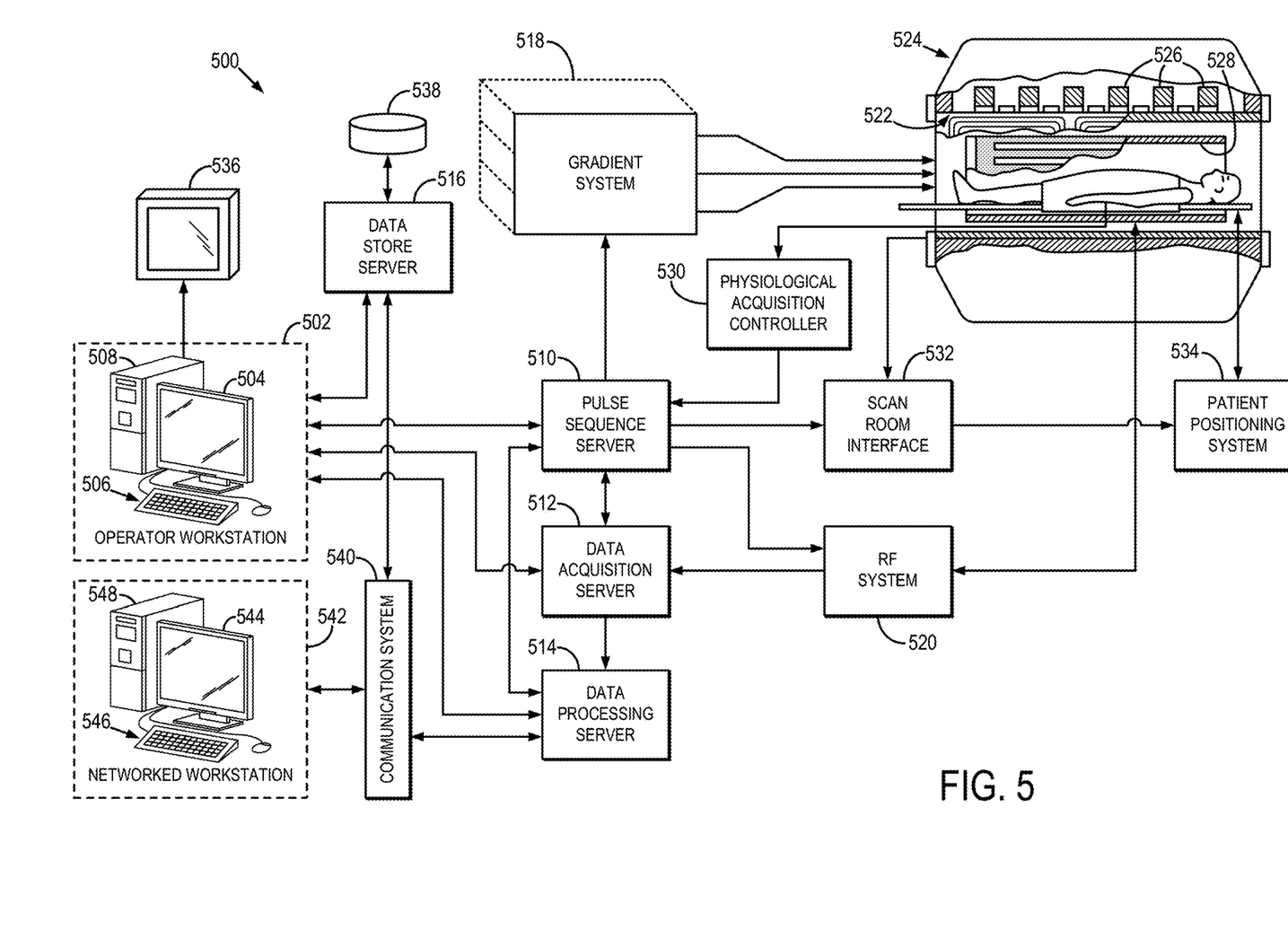
FIG. 5 is a block diagram of an example MRI system that can implement the systems and methods described in the present disclosure.

Referring particularly now to FIG. 5, an example of an MRI system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. An RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (20);$$

and the phase of the received magnetic resonance signal may also be determined according to the following relationship:

$$\varphi = \tan^{-1}\left(\frac{Q}{I}\right). \quad (21)$$

The pulse sequence server 510 may receive patient data from a physiological acquisition controller 530. Byway of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or in a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present disclosure has described one or more preferred embodiments, and it should be appreciated that many equivalents, alternatives, variations, and modifications, aside from those expressly stated, are possible and within the scope of the invention.

The invention claimed is:

1. A method for reconstructing an image from undersampled k-space data acquired with a magnetic resonance imaging (MRI) system, the steps of the method comprising:
   (a) providing to a computer system, undersampled k-space data and calibration data acquired with an MRI system;
   (b) processing the calibration data with a computer system to learn parameters for a residual machine learning algorithm implemented with a hardware processor and memory of the computer system, wherein the residual machine learning algorithm comprises a linear residual connection and a multi-layer portion having at least one nonlinear processing layer;
   (c) estimating missing k-space data by inputting the undersampled k-space data to the residual machine learning algorithm, generating output as the missing k-space data; and
   (d) reconstructing an image from the undersampled k-space data and the estimated missing k-space data.

2. The method as recited in claim 1, wherein the at least one nonlinear processing layer implements a nonlinear activation function applied to a linear convolution.

3. The method as recited in claim 1, wherein:
   the linear residual connection comprises a linear convolution; and
   the multi-layer portion comprises a plurality of layers in which each layer includes applying a convolution operation on data input to that layer, wherein each of the plurality of layers comprises a number of input channels and a number of output channels, and wherein at least some of the plurality of layers comprise applying nonlinear processing on an output of the convolution operation.

4. The method as recited in claim 3, wherein the learned parameters comprise weights for the convolution operation in each layer of the multi-layer portion and for the linear convolution in the linear residual connection.

5. The method as recited in claim 4, wherein the learned parameters further comprise biases for at least some of the plurality of layers.

6. The method as recited in claim 3, wherein the nonlinear processing includes applying an activation function to the output of the convolution operation.

7. The method as recited in claim 6, wherein the activation function comprises a rectified linear unit.

8. The method as recited in claim 3, wherein the nonlinear processing includes applying batch normalization to the output of the convolution operation.

9. The method as recited in claim 1, wherein the multi-layer portion comprises a plurality of layers and each of the plurality of layers except a last one of the plurality of layers implements nonlinear processing.

10. The method as recited in claim 1, wherein the calibration data are acquired as auto-calibration signal (ACS) data together with the undersampled k-space data.

11. The method as recited in claim 1, wherein the calibration data are acquired in a separate scan from the undersampled k-space data.

12. The method as recited in claim 1, wherein processing the calibration data with a computer system to learn the parameters for the residual machine learning algorithm includes minimizing a loss function.

13. The method as recited in claim 1, wherein the residual machine learning algorithm is a residual convolutional neural network (CNN), such that the multi-layer portion comprises a multi-layer CNN.

14. The method as recited in claim 13, wherein the multi-layer CNN comprises a feedforward network.

15. The method as recited in claim 13, wherein the multi-layer CNN comprises dense connections wherein an input to at least one layer comprises a concatenation of output generated from previous layers.

16. The method as recited in claim 1, wherein the missing k-space are estimated by:
 initializing with the computer system and using the calibration data, an objective function comprising data consistency term, a k-space interpolation consistency term, and a coil self-consistency term;
 minimizing the objective function with the computer system, generating output as the missing k-space data; and
 wherein the k-space interpolation consistency term comprises inputting the undersampled k-space data to the residual machine learning algorithm.

17. The method as recited in claim 16, wherein the objective function further comprises a regularization term.

18. The method as recited in claim 17, wherein the regularization term is based on a locally low-rank constraint.

19. The method as recited in claim 17, wherein the regularization term is based on a wavelet-domain regularizer.

20. The method as recited in claim 17, wherein the regularization term is based on a total variation.

21. The method as recited in claim 17, wherein the regularization term is based on a machine learning-based regularizer.

* * * * *